(12) United States Patent
Yang et al.

(10) Patent No.: US 12,343,941 B2
(45) Date of Patent: Jul. 1, 2025

(54) TOMOGRAPHIC VAT PHOTOPOLYMERIZATION FOR 3D PRINTING OF OBJECTS WITH INTERNAL PROPERTY-VARIATION

(71) Applicant: DANMARKS TEKNISKE UNIVERSITET, Kongens Lyngby (DK)

(72) Inventors: Yi Yang, Kongens Lyngby (DK); Kristoffer Almdal, Kongens Lyngby (DK)

(73) Assignee: DANMARKS TEKNISKE UNIVERSITET, Kongens Lyngby (DK)

( * ) Notice: Subject to any disclaimer, the term of this patent is extended or adjusted under 35 U.S.C. 154(b) by 0 days.

(21) Appl. No.: 18/250,409

(22) PCT Filed: Oct. 27, 2021

(86) PCT No.: PCT/EP2021/079839
§ 371 (c)(1),
(2) Date: Apr. 25, 2023

(87) PCT Pub. No.: WO2022/090318
PCT Pub. Date: May 5, 2022

(65) Prior Publication Data
US 2024/0009931 A1   Jan. 11, 2024

(30) Foreign Application Priority Data
Oct. 27, 2020   (EP) .................................... 20204050

(51) Int. Cl.
*B29C 41/22*       (2006.01)
*B29C 64/124*      (2017.01)
(Continued)

(52) U.S. Cl.
CPC .......... *B29C 64/393* (2017.08); *B29C 64/124* (2017.08); *B29C 64/277* (2017.08);
(Continued)

(58) Field of Classification Search
CPC ..... B29C 41/22; B29C 64/124; B29C 64/129; B29C 64/277; B29C 64/386;
(Continued)

(56) References Cited

U.S. PATENT DOCUMENTS

2010/0128033 A1   5/2010  Stevens et al.
2018/0326666 A1   11/2018 Kelly et al.
(Continued)

FOREIGN PATENT DOCUMENTS

CN    111196033 A    5/2020
EP      3018531 A1   5/2016
(Continued)

OTHER PUBLICATIONS

Larsen, E., et al., Multimaterial hydrogel with widely tunable elasticity by selective photopolymerization of PEG diacrylate and epoxy monomers, Journal of Polymer Physics, 54(13): 1195-1201, Jul. 1, 2016 (Abstract).
(Continued)

*Primary Examiner* — Leo B Tentoni
(74) *Attorney, Agent, or Firm* — DINSMORE & SHOHL LLP

(57) ABSTRACT

A method for producing a multi-material three-dimensional object includes: computing projections describing the object from different orientation angles, including: a number of first projections describing a first part of said object to be formed in a first material; a number of second projections describing a second part of said object to be formed in a second material; providing a build volume comprising: a first photosensitive component for polymerizing into the first mate-
(Continued)

rial upon irradiation by a first wavelength light; a second photosensitive component for polymerizing into the second material upon irradiation by a second wavelength light, the second material having different mechanical properties than the first; and irradiating the build volume with a number of patterns of light, at the respective corresponding orientations/wavelengths such that the first wavelength light deposits energy according to a first energy distribution and the second wavelength light deposits energy according to a second energy distribution.

18 Claims, 4 Drawing Sheets

(51) Int. Cl.
| | |
|---|---|
| *B29C 64/129* | (2017.01) |
| *B29C 64/277* | (2017.01) |
| *B29C 64/393* | (2017.01) |
| *B33Y 10/00* | (2015.01) |
| *B33Y 30/00* | (2015.01) |
| *B33Y 50/02* | (2015.01) |
| *C08F 2/46* | (2006.01) |
| *C08F 20/06* | (2006.01) |
| *C08L 63/00* | (2006.01) |
| *B29K 33/00* | (2006.01) |
| *B29K 33/04* | (2006.01) |
| *B29K 63/00* | (2006.01) |

(52) U.S. Cl.
CPC ............... *B33Y 10/00* (2014.12); *B33Y 30/00* (2014.12); *B33Y 50/02* (2014.12); *B29K 2033/04* (2013.01); *B29K 2033/08* (2013.01); *B29K 2063/00* (2013.01)

(58) Field of Classification Search
CPC .............. B29C 64/393; B29K 2033/08; B29K 2063/00; B33Y 10/00; B33Y 30/00; B33Y 50/00; B33Y 50/02; C08F 2/46; C08F 20/06; C08L 63/00
USPC ..... 264/250, 255, 331.12, 331.18, 401, 494; 425/135, 174.4; 522/100, 153; 525/187
See application file for complete search history.

(56) References Cited

U.S. PATENT DOCUMENTS

| | | | |
|---|---|---|---|
| 2020/0101673 | A1 | 4/2020 | Kelly et al. |
| 2020/0171740 | A1 | 6/2020 | Boydston et al. |
| 2020/0384682 | A1* | 12/2020 | Loterie ................. B29C 64/124 |

FOREIGN PATENT DOCUMENTS

| | | | |
|---|---|---|---|
| WO | WO2019/043529 | A1 | 3/2019 |
| WO | WO2020/185690 | A1 | 9/2020 |

OTHER PUBLICATIONS

Schwartz, J., et al., Multimaterial actinic spatial control 3D and 4D printing, Nature Communications, 10(791), Feb. 15, 2019, pp. 1-10.

* cited by examiner

TOMOGRAPHIC VAT PHOTOPOLYMERIZATION FOR 3D PRINTING OF OBJECTS WITH INTERNAL PROPERTY-VARIATION

CROSS-REFERENCE TO RELATED APPLICATIONS

This application is the U.S. National Stage of PCT/EP2021/079839 filed on Oct. 27, 2021, which claims priority to European Patent Application 20204050.7 filed on Oct. 27, 2020, the entire content of both are incorporated herein by reference in their entirety.

FIELD OF THE INVENTION

The present disclosure relates to methods and systems for producing multi-material three-dimensional objects by irradiation of a build volume in a number of patterns of light at specific orientations and wavelengths. A method comprises irradiating a build volume such that, for each wavelength, a three-dimensional energy distribution is generated that defines the solidified material and the properties of the illuminated parts of the build volume.

BACKGROUND OF THE INVENTION

3-D printing is an additive manufacturing (AM) technique for fabricating a wide range of structures and complex geometries based on three-dimensional model data. The process relies on printing of successive layers of materials on top of each other. The technology was originally developed by Charles Hull in 1986 in a process known as stereolithography (SLA).

In SLA, UV light, or electron beam, is used to initiate a chain reaction on a layer of resin or monomer solution, for example acrylic or epoxy-based. The monomers are UV-active and convert to polymer chains after activation (radicalization). The polymerization leads to the generation of a pattern inside the resin layer that is solidified, and that can hold the subsequent layers. Following printing, the unreacted resin is removed. Additionally, depending on the material and the desired mechanical properties, post-process treatments such as heating or photo-curing may be applied to the printed object.

While SLA is a versatile method that has gained widespread use, mainly attributing to its success in rapid and cheap prototyping, it suffers from slow printing speeds. This is a property that is inherent to SLA, as it is a layer-by-layer processing method. Once a layer is irradiated and cured, a new layer of uncured material must be provided above or below the solid layer, depending on the build direction. Most commonly, the uncured material is provided by mechanically recoating of the surface which, in addition to increasing the printing time, may act to distort the formed parts.

SUMMARY OF THE INVENTION

The present inventors have realized that 3D-printing does not have to be limited to layer-by-layer processing, instead the present inventors have realized that 3D-printing may be achieved by a method that may reproduce an object by a three-dimensional energy distribution projected onto a build-volume. The build volume may comprise multiple photosensitive components, wherein activation of each photosensitive component may respectively lead to formation of a material having a different property, for example a different mechanical property. In this way, the method may allow for rapid production of complex materials. Additionally, the build volume may comprise cells, such as undifferentiated stem cells, for example induced pluripotent stem cells. The method may for example be applied to the formation of artificial tissues, such as for in vitro drug screening or in vivo grafting.

Therefore, the present disclosure relates, in a first aspect, to a method for producing a multi-material three-dimensional object comprising:

computing a number of projections describing the multi-material three-dimensional object to be formed from different orientation angles of said object, including:
a. a number of first projections describing a first part of said object to be formed in a first material;
b. a number of second projections describing a second part of said object to be formed in a second material;
providing a build volume comprising:
c. a first photosensitive component capable of polymerizing into the first material upon irradiation by light having a first wavelength;
d. a second photosensitive component capable of polymerizing into the second material upon irradiation by light having a second wavelength, the second material having different mechanical properties than the first material; and
irradiating the build volume with a number of patterns of light, as defined by the projections, at the respective corresponding orientations and wavelengths such that the light having the first wavelength deposits energy according to a first energy distribution and wherein the light having the second wavelength deposits energy according to a second energy distribution;
thereby physically reproducing said multi-material three-dimensional object.

Tomographic vat photopolymerization enables ultrafast 3D printing that is not limited to layer-by-layer processing. The method may comprise multiple photosensitive components and one or more light sources for producing light of multiple wavelengths, and may result in reproduction of a multi-material three-dimensional object with an internal property variation that is defined on a voxel-by-voxel basis.

By selecting a number of photosensitive components that, upon activation, form materials having specific desired properties, such as different stiffness, combined with formation of three-dimensional energy distributions that are unique for each wavelength, corresponding to each photosensitive components, the property distribution of the multi-material three-dimensional object can be selected individually for each voxel. Preferably, the method is arranged such that the dose ratio between different wavelengths may be specified individually for each voxel of the build volume, which translates to for example voxel-by-voxel chemical and mechanical property-customization.

Preferably, the step of computation of the first projections and the second projections is defined by the mechanical property distribution of the multi-material three-dimensional object. For example the multi-material three-dimensional object may be reproduced in a number of voxels of the build volume, and wherein the step of computing comprises determining, for each of said voxels, a ratio between the light having the first wavelength and the light having the second wavelength such that, upon irradiation of said voxels by said ratios, the mechanical properties of each voxel is determined.

Typically, the three-dimensional multi-material object consists or comprises a functionally graded material, such as wherein the mechanical stiffness varies gradually in three-dimensions of the objects. While certain embodiments may comprise sequential activation of the photosensitive components, it is a preference that the activation of the photosensitive components at least partly overlap, preferably completely overlap, i.e. the photosensitive components are activated simultaneously. In general, only simultaneous irradiation of a build volume with light comprising a first wavelength and a second wavelength is capable of producing such functionally graded material, i.e. wherein said first and second wavelengths may be used to separately activate at least one of a first and a second photosensitive components of said build volume.

The build volume may comprise a number of photosensitive components and an equal number of three-dimensional energy-distributions may be irradiated to the build volume. Each of said energy distributions is typically provided by a different wavelength distribution and/or a different wavelength of light, in order to activate a separate photosensitive component. Thereby, each three-dimensional energy distribution leads to a distribution of a material, of the reproduced object, corresponding to the wavelength distribution of the irradiation, and consequently, a distribution of a property, such as a mechanical property.

The present disclosure relates, in a second aspect, to a system for producing a multi-material three-dimensional object from a build volume, the system comprising:

a processing unit configured for computing a number of projections describing the multi material three-dimensional object to be formed from different orientation angles of said object, including:

a. a number of first projections describing a first part of said object to be formed in a first material;

b. a number of second projections describing a second part of said object to be formed in a second material;

a projection system capable of emitting controlled spatial patterns of light at multiple wavelengths, said controlled spatial patterns being derived from the projections;

the build volume comprising:

c. a first photosensitive component capable of polymerizing into the first material upon irradiation by light having a first wavelength; and d. a second photosensitive component capable of polymerizing into the second material upon irradiation by light having a second wavelength of photosensitive material;

a direction adjustment unit for controllably varying a direction of incidence of said patterns of light relative to said build volume; and a controller configured for controlling the direction adjustment unit and the projection system such that the build volume is irradiated with a number of patterns of light, as defined by the projections, at the respective corresponding orientations and wavelengths such that the light having the first wavelength deposits energy according to a first energy distribution and wherein the light having the second wavelength deposits energy according to a second energy distribution.

The projections may for example be formed by the application of a Radon-transform followed by a tomographic reconstruction filter. The resulting projections may be two-dimensional patterns, that each have a corresponding orientation angle. Irradiation of the build volume may be carried out by the use of multiple light sources, which may irradiate the build volume from different angles, or a single light source may be used. It is however a preference that the light patterns based on the first projections are irradiated at a different wavelength distribution than the light patterns based on the second projections.

Preferably, the system is configured for illuminating the build volume with a first sequence of spatial light patterns at a first wavelength, and concurrently or subsequently illuminating said build volume with a second sequence of spatial light patterns at a second wavelength until the multi-material three-dimensional object is formed. The system may however be configured for illuminating the build volume with any number of sequences of spatial light patterns, each having a different wavelength, and each having a corresponding photosensitive component that is activated at each respective wavelength.

DETAILED DESCRIPTION OF THE INVENTION

Figure 1A:
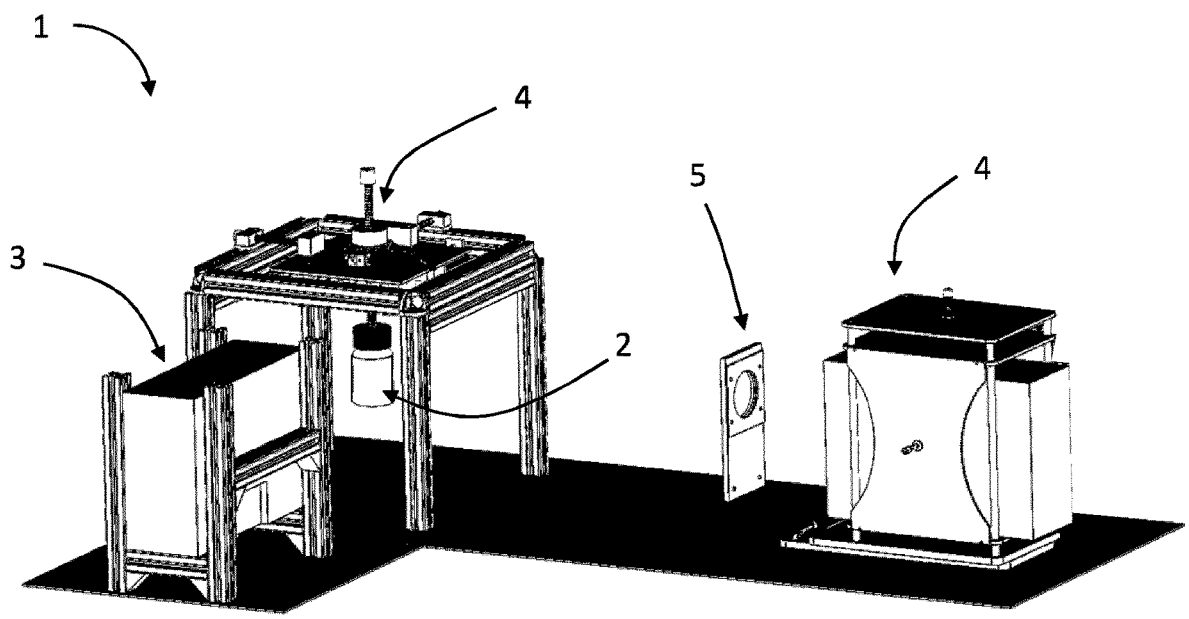
FIG. 1 shows a system for producing a multi-material three-dimensional object from a build volume according to a specific embodiment of the present disclosure.

As used herein, the term photosensitive component is a material that changes its properties when exposed to electromagnetic radiation, typically light in the visible or ultraviolet region. These changes are often manifested structurally, for example hardening of the material occurs as a result of cross-linking when exposed to light. The material may comprise a photoinitiator and/or photosensitizer in order to be activated by said electromagnetic radiation. Activation may lead to polymerization of other components of the photosensitive components, such as a monomer and/or a pre-polymer.

As used herein, the term polymerization is a process of reacting pre-polymer and/or monomer molecules together in a chemical reaction to form polymer chains or three-dimensional networks. Photopolymerization reactions are typically chain-growth polymerizations which are initiated by the absorption of visible or ultraviolet light. The light may be absorbed either directly by the reactant monomer (direct photopolymerization), or by a photosensitizer or a photoinitiator.

As used herein, the term prepolymer refers to a monomer, or system of monomers, that have been reacted to an intermediate molecular mass state, that is capable of polymerization, or further polymerization, by reactive groups to a higher molecular weight state.

As used herein, the term photoinitiator refers to a molecule that absorbs photons upon irradiation with light and forms reactive species out of the excited state, which initiate consecutive reactions. The initiating species may be radicals, cations, or anions. Different photoinitiators are distinguished by the wavelength range in which they present high-energy absorption, and are thus readily described by their unique absorption spectra. The choice of excitation light source wavelength and photoinitiator composition are thus inextricably linked to one another.

As used herein, the term direction adjustment unit refers to a system that is configured for controlling the relative orientation of the build volume and the projection unit. For example, the direction adjustment unit may comprise a direction adjustment unit configured for rotating the build volume, such as while the projection unit is stationary, thereby projecting at the build volume from multiple orientations. Alternatively or additionally, the projection unit may revolve around the build volume. Typically, the revolutions and/or rotations are in a horizontal plane, however they may be in any plane.

As used herein, the term voxels refer to each of an array of elements of volume that constitute a notional three-dimensional space, especially each of an array of discrete elements into which a representation of a three-dimensional object is divided, such as a multi-material three-dimensional object. Contrary to this, points, or pixels, typically refers to discrete points, such as the smallest addressable discrete element.

In a first aspect, the present disclosure relates to a method for producing a three-dimensional object comprising multiple materials. It is a preference that the method comprises a step of computing a number of projections describing the multi-material three-dimensional object to be formed from different orientation angles of said object. Said number of projections may comprise a number of first projections describing a first part of said object to be formed in a first material and/or a number of second projections describing a second part of said object to be formed in a second material.

In a further embodiment of the present disclosure, the method comprises providing a build volume, for example contained by a receptacle. The build volume typically comprises a number of components that, when exposed to light, such as light of a specific wavelength, polymerizes. Preferably the build volume comprises a first photosensitive component capable of polymerizing into a first material upon irradiation by light having a first wavelength. The build volume may alternatively or additionally comprise a second photosensitive component capable of polymerizing into a second material upon irradiation by light having a second wavelength, wherein the second wavelength may be different from the first wavelength. In a specific embodiment the first and the second photosensitive component may be polymerized by an identical wavelength, in such a case it may be a preference that said components have a different response to said identical wavelength. For example they may have different optical absorbances so that one of the first or the second photosensitive component has a faster polymerization reaction. It may for example be a preference that the absorption maximum for the first photosensitive component is different from the absorption maximum for the second photosensitive component.

In a further embodiment of the present disclosure, the method comprises a step of irradiating a build volume. Preferably, the irradiation comprises irradiating the build volume with a number of patterns of light that are based on a number of projections. The irradiation is preferably carried out at the respective corresponding orientations and wavelengths. The orientations preferably agree with the angle of the projection. The wavelengths are selected based on the photosensitive components of the build volume. Typically, multiple photosensitive components are used, for example photosensitive components that can be used for the manufacturing of graded objects. In the case of multiple photosensitive components it is a preference that the wavelength, in combination with the orientation and the energy distribution, is selected such that specific parts of the object are formed from a first photosensitive component while other parts of said object are formed from a second photosensitive component. By the use of photosensitive components that polymerize into materials with different properties, such as mechanical properties, complex objects may be rapidly formed. In an embodiment of the present disclosure, the step of irradiating comprises or consists of irradiating the build volume with a number of patterns of light, as defined by the projections, at the respective corresponding orientations and wavelengths such that the light having the first wavelength deposits energy according to a first energy distribution and wherein the light having the second wavelength deposits energy according to a second energy distribution, such as in the build volume. Preferably, said irradiation is configured such that the multi-material three-dimensional object is reproduced in the build volume.

In an embodiment of the present disclosure, the mechanical property, of each point of the reproduced multi-material three-dimensional object, is determined by the ratio between the first energy distribution and the second energy distribution deposited to said point. Selection of the photosensitive components such that the first photosensitive component is capable of polymerizing into the first material upon irradiation by light having a first wavelength, and such that the second photosensitive component is capable of polymerizing into the second material upon irradiation by light having a second wavelength, the ratio between the first energy distribution and the second energy distribution may determine the mechanical properties of each point of the multi-material three-dimensional object, such as each voxel of the multi-material three-dimensional object. In an embodiment of the present disclosure the method comprises a step of computing a number of projections describing the multi-material three-dimensional object to be formed from different orientation angles of said object, a step of providing a build volume, and a step of irradiating the build volume with a number of patterns of light, wherein the step of irradiating is after the steps of computing a number of projections and providing the build volume. Therefore in an embodiment of the present disclosure, the step of computing is after the steps of computing a number of projections, and providing the build volume. In a specific embodiment the step of providing the build volume is before the step of computing a number of projections. In another embodiment, the step of computing a number of projections is after the step of providing the build volume.

In a further embodiment of the present disclosure, the multi-material three-dimensional object is reproduced in a number of voxels of the build volume, and wherein the step of computing comprises determining, for each of said voxels, a ratio between the light having the first wavelength and the light having the second wavelength such that, upon irradiation of said voxels by said ratios, the mechanical properties of each voxel is determined. The size of the voxel may be the resolution of the method, as the properties of the multi-material three-dimensional object is defined for each voxel of said object.

In yet an embodiment of the present disclosure, the step of computation of the first projections and the second projections is defined by the mechanical property distribution of the multi-material three-dimensional object. For example the computation may be configured, together with the step of irradiating, such that upon irradiating the build volume with patterns of light, derived from said projections, the multi-material three-dimensional object is reproduced. Properties, such as mechanical properties, for example stiffness, of the multi-material three-dimensional object may be determined by the ratio between the first and the second energy distribution. The first and the second energy distribution may be deposited to the build volume in the irradiating step, as a result of irradiating the build volume with the number of patterns of light, at the respective orientations and wavelengths.

It is a preference that the first material and the second material have different properties. For example the first material and the second material may have different mechanical properties, such as when completely polymerized. The first material and the second material may however be different in alternative and/or additional properties. A skilled person knows photosensitive components having different properties that would be suitable for use in combination with the presently disclosed method, such that the multi-material three-dimensional object comprises points and/or voxels that differ in one or multiple properties, for example one mechanical property. Therefore, in a specific embodiment of the present disclosure, the first material is stiffer than the second material, and wherein the step of irradiating comprises depositing a higher dose of the light having the first wavelength relative to the light having the second wavelength, at corresponding points of the multi-material three-dimensional object that are stiffer.

In an embodiment of the present disclosure, the first photosensitive component comprises an epoxy monomer and a first photoinitiator that is activated upon irradiation by the light having the first wavelength, and wherein the second photosensitive component comprises an acrylate monomer and a second photoinitiator that is activated upon irradiation by the light having the second wavelength.

In an embodiment of the present disclosure, the step of irradiating comprises:
  a. irradiating the build volume, by a projection system, with a first number of patterns of light that are defined by the first projections, with the light having the first wavelength; and
  b. irradiating the build volume, by a projection system, with a second number of patterns of light that are defined by the second projections, with the light having the second wavelength.

The projection system may comprise a single of multiple projection units that are configured such that the build volume is irradiated, by a projection unit, with a first number of patterns of light, simultaneously and/or sequentially, as the build volume is irradiated, by the same projection unit or a separate projection unit, with a second number of patterns of light. The projection system may for example comprise a first projection unit for irradiating the build volume with a first number of patterns of light that are defined by the first projections, with the light having the first wavelength and a second projection unit for, simultaneously and/or sequentially, irradiating the build volume with a second number of patterns of light that are defined by the second projections, with the light having the second wavelength.

In an embodiment of the present disclosure, the first projection unit, the second projection unit, and the build volume are located in a plane, and wherein the build volume rotates with an axis of rotation that is perpendicular to said plane and intersects the center of said build volume In an embodiment of the present disclosure, the projections, such as the first projection and/or the second projections, are computed using any one of the following list: a Radon-transform followed by a tomographic reconstruction filter; a fan-beam algorithm followed by a tomographic reconstruction filter; and/or a cone-beam algorithm followed by a tomographic reconstruction filter.

The first and the second wavelength are preferably two different wavelengths, sufficiently spectrally separated such that irradiating with the first light or the second light only results in polymerization of one of the first photosensitive components or the second photosensitive component. In an embodiment of the present disclosure, one of the first wavelength and the second wavelength is in the UV region and the other in the visible region.

In an embodiment of the present disclosure, the reproduced multi-material three-dimensional object consists of a functionally graded material. Functionally Graded Materials (FGMs) may be characterized by the variation in composition and structure gradually over volume, resulting in corresponding changes in the properties of the material.

In an embodiment of the present disclosure, the multi-material three-dimensional object comprises portions, such as voxels and/or points, with Young's moduli that differ at least two orders of magnitude, preferably at least four orders of magnitude, more preferably at least five orders of magnitude, yet more preferably at least six orders of magnitude.

In an embodiment of the present disclosure, the multi-material three-dimensional object is an artificial tissue, such as for in vitro drug screening or in vivo grafting. The multi-material three-dimensional object may be a scaffold for tissue engineering. In an embodiment of the present disclosure, the build volume comprises cells, and wherein the cells are arranged such that upon irradiation of the build volume, the cells are incorporated into the multi-material three-dimensional object. In an embodiment of the present disclosure the cells may be induced pluripotent stem cells (iPS cells).

Graded Material

In an embodiment of the present disclosure the computation of the projections is at least in part defined by the mechanical property distribution of the multi-material three-dimensional object. The multi-material three-dimensional object may comprise or consist of a functionally graded material, such as be composed of a functionally graded material. The projections may be defined by a combination by the shape of the three-dimensional object and the property distribution of the object. The computation of the projections may for example be configured to derive projections, at multiple angles of the three-dimensional object, wherein the projections comprise wavelength and/or energy distributions. Preferably the computation is such that the projection, when projected onto the build volume, at the respective orientations, produces a multi-material three-dimensional object. The wavelength and energy distribution of the projections are preferably selected such that they result in, when projected onto the build volume at the respected orientation, produce an object having a desired distribution of one or more properties, such as mechanical properties. The projections may for example each be carried out with a specific pattern and with a specific wavelength or a specific wavelength distribution. Preferably said wavelengths or wavelength distributions are selected such that they each correspond to the photosensitive components of the build volume, for example the first and the second photosensitive components. They may for example each be, or include, the absorption maximum of each photosensitive component.

In an embodiment of the present disclosure the computation of the material to use, polymerize, or activate, in the formation of specific parts of the multi-material three-dimensional object is defined by the property distribution of said object, such as the mechanical property distribution. Thereby, the distributions of the properties of the three-dimensional object is typically important to the computation of the projections. The projections which may comprise or consist of two-dimensional energy distributions at multiple or single wavelength are preferably configured such that, when projected onto the build volume, at their respective orientations, the energy and wavelength distribution of the projections results in a three-dimensional energy and wavelength distribution in the build volume. The build volume is preferably configured such that, upon receiving said three-dimensional energy and wavelength distribution, it polymerizes into a multi-material three-dimensional object. It is a further preference that said object is a functionally graded material having a variation in composition and/or structure.

In an embodiment of the present disclosure each projection comprises or consists of an energy distribution and wherein the computation of the energy distributions of the projections is defined by the mechanical property distribution of the multi-material three-dimensional object. The projections may comprise or consist of two-dimensional energy distributions that, when projected onto the build volume, at each respective angle, as defined during the computation, results in a three-dimensional energy and/or wavelength distribution. Preferably, the build volume is configured such that said three-dimensional energy and/or wavelength distribution results in the manufacturing of a multi-material three-dimensional object. For example, the build volume may comprise multiple photosensitive components that each polymerizes at specific, such as different, wavelengths and/or above specific, such as different, energy thresholds.

In an embodiment of the present disclosure the mechanical properties of the materials differ, such as the first and the second material, such as when completely polymerized. The multi-material three-dimensional object may thereby comprise multiple materials that have different properties. The materials, such as the first and the second material, may differ in any type of property, for example mechanical, optical, electrical, thermal, chemical, acoustical, atomic, magnetic, and/or radiological properties. Thereby, the multi-material three-dimensional object may be composed of a functionally graded material, wherein any of mechanical, optical, electrical, thermal, chemical, acoustical, atomic, magnetic, and/or radiological properties varies over its volume.

In an embodiment of the present disclosure the build volume is provided with an energy distribution, during the irradiating step, that is based on or derived from the distribution of the mechanical properties of the multi-material three-dimensional object. Preferably the present disclosure comprises computation of a number of projections, at specific orientations of the object, and thereafter projection of said projections on a build volume such that said object is reproduced in said build volume. Thereby, the reproduced object preferably has identical properties as the initial object. The initial object can here be said to be a model, for example a model of the three-dimensional multi-material object. Preferably the model comprises information about the shape and the distribution of at least one property, such as the distribution of the mechanical properties. By computing a number of projections, of the model, at specific orientation and projecting said projections onto a build volume, the model is preferably reproduced. It should be noted that the reproduced object may be modified with respect to the model, for example uniformly or non-uniformly scaled.

In an embodiment of the present disclosure the energy distribution is different for each wavelength. It is a preference that each computed projection comprises or consists of a two-dimensional pattern. The two-dimensional patterns are preferably thereafter projected onto a build volume, at the computed respective orientations of each projection, thereby rendering a three-dimensional energy distribution, in the build volume. The step of projecting, said projections, may be carried out by projecting at a single wavelength, such that only one, or only a few, of the photosensitive components are activated, or polymerized, at each consecutive projection. It should also be noted that only one, or only a few, of the photosensitive components may also be activated, or polymerized, at each consecutive projection, at projections of multiple wavelengths. In such a case, said multiple wavelengths are preferably selected such that they only activate or polymerize only one or only a few of the photosensitive components. In any of these cases, wherein only one or only a few of the photosensitive components are activated or polymerized, by said one or more wavelengths, the projections may comprise multiple sequences of projections, i.e. multiple sequences of two-dimensional patterns, that when projected onto the build volume at their respective orientations, such as computed during the computation step, leads to activation and/or photopolymerization of one or substantially only one of the photosensitive components, thereby leading to formation of a first part of the three-dimensional multi-material object. By projecting the build volume by an additional, such as a second, sequence of projections, i.e. two-dimensional patterns, additional, such as the second, photosensitive component may be activated and/or photopolymerized, thereby forming the additional, such as second part of the three-dimensional multi-material object, and wherein the additional, such as the second, part of the three-dimensional multi-material object, has different properties than the first part.

In a preferred embodiment of the present disclosure, the computed projections comprise at least a first sequence of projections, and a second sequence of projections. It is a preference that each sequence of projections is configured for manufacturing a part of the three-dimensional multi-material object, such as a first part or a second part, upon projecting each projection onto the build volume at each corresponding orientation. It is a further preference that said parts of the three-dimensional multi-material object each have different properties, such as mechanical properties. It is yet a further preference that each sequence of projections are projected at one or more wavelengths that is specific for only one of the photosensitive components, and preferably wherein said one or more wavelengths are selected such that they form a part of the three-dimensional multi-material object having the desired properties, such as mechanical properties, such as for reproducing the property/properties of the corresponding part of the model.

In an embodiment of the present disclosure at least a portion of the parts of the multi-material three-dimensional object to be formed in the first material and the second material overlap. Consequently, following the projection of one or more sequences of projections onto the build volume, wherein each sequence of projections may have a wavelength distribution that are specific for one or more photosensitive components, the resulting three-dimensional energy-distribution for each wavelength distribution may overlap. Preferably each wavelength distribution is selected such that it only, or mainly, activates, or leads to photopolymerization of, a single photosensitive component. Each projection of the sequence of projections is preferably projected onto the build volume by a specific wavelength distribution, such as each specific for one photosensitive component. Preferably, the projection of each sequence of projections, wherein each sequence of projection is projected at a specific wavelength distribution, is carried out such that it results in a three-dimensional energy distribution for each wavelength distribution. In a specific embodiment of the present disclosure, the three-dimensional energy distribution for at least two wavelength distributions, at least partly overlap. Thereby, a reproduced multi-material three-dimensional object may comprise parts that comprises or consists of multiple materials, such as a first material, a second material, and/or a number of further materials.

In an embodiment of the present disclosure the multi-material three-dimensional object is composed of a graded material, such as a functionally graded material. Functionally graded materials (FGMs) are multifunctional materials, which contain a spatial variation in composition and/or microstructure for the specific purpose of controlling variations in properties, such as mechanical, thermal, structural and/or functional properties. FGMs may be characterized by the variation in composition and structure gradually over volume, resulting in corresponding changes in the properties of the material. The materials can be designed for specific functions and applications.

In an embodiment of the present disclosure the multi-material three-dimensional object comprises portions with Young's moduli that differ at least one order of magnitude, preferably at least two orders of magnitude, yet more preferably at least three orders of magnitude. An advantage with the presently disclosed embodiments is its ability to reproduce objects having properties, such as a mechanical property, that varies over a large interval. This is often the case in nature, for example in vertebrates having soft tissue and hard tissue. Thereby, the presently disclosed method may be used to correctly reproduce complex objects.

In an embodiment of the present disclosure the computing step further comprises computing at least one further projection describing at least one further part of said object to be formed in at least one further material. As disclosed elsewhere herein, any parts of the object, such as the first part, the second part, and/or any further part, may overlap partly or completely. Thereby, parts of the objects may comprise multiple materials. In a specific embodiment of the present disclosure, the three-dimensional energy distribution, for each wavelength distribution, that is a result of the projection of each sequence of projections onto the build volume, results in a degree of activation and/or photopolymerization that corresponding to the energy in each position/voxel of said three-dimensional energy distribution. Consequently, the properties of the reproduced object may be a result of the energy distribution and the wavelength distribution at each voxel, i.e. a three dimensional distribution, wherein the resulting properties is not just dependent on whether the energy at each voxel is above or below a threshold energy, but wherein the properties of each voxel is determined by a continuous response to the energy.

In an embodiment of the present disclosure the build volume further comprises at least one further photosensitive component capable of polymerizing into at least one further material. In principle there is no limitation to the number of materials of the reproduced multi-material three-dimensional object. In one embodiment of the present disclosure the build volume comprises multiple photosensitive components, each responsive to, such as activated and/or polymerized by, a different wavelength distribution, such as a single or multiple wavelengths. It is a further preference that a number of sequences of projections are computed wherein each said sequence comprises a number of projections, at specific orientations, of a three-dimensional multi-material object or model. Upon projection of said sequence of projections onto a build volume, an energy distribution in said build volume is generated for each wavelength distribution, and consequently for activating and/or polymerizing a specific photosensitive component. It is a preference that said specific photosensitive component is selected such that the properties of the reproduced three-dimensional multi-material object correspond to the three-dimensional multi-material object/model. Thereby, for each voxel of the build volume, the projection and the projection of said projection, is configured such that the energy distribution for each wavelength distribution activates and/or polymerizes the specific photosensitive components that renders the voxel of said reproduced three-dimensional multi-material object to have the properties of the three-dimensional multi-material object/model.

Photosensitive Components

In an embodiment of the present disclosure each of the photosensitive components comprises a prepolymer, such as a monomer; and a photoactivator such as a photosensitizer, a photoinitiator, or a mixture thereof. Preferably the photosensitive component is configured such that it is activated by irradiation of light, and wherein said activation leads to a polymerization of the prepolymer. The activation is typically generated through activation of the photoactivator, that in turn generates, typically through catalysis, polymerization of the prepolymer. Commonly, the photoactivator is susceptible to activation in a specific wavelength range/wavelength distribution. In an embodiment of the present disclosure, at least one of the first wavelength and the second wavelength is capable of activating and/or polymerizing both the first photoresponsive component and the second photoresponsive component. It is however a preference that at least one, such as both, of the first wavelength and the second wavelength is not capable of activating and/or polymerizing both the first photoresponsive component and the second photoresponsive component. In specific embodiments of the present disclosure, the first photoresponsive component and the second photoresponsive component are activated at separate wavelengths.

For photoinitiation to proceed efficiently, the absorption bands of the photoinitiator must overlap with the emission spectrum of the source, i.e. the wavelength distribution used for polymerization of that specific photosensitive component, and there should preferably be minimal competing absorption by the components of the formulation at the wavelengths corresponding to photoinitiator excitation.

In an embodiment of the present disclosure each photosensitive component comprises a different type of photoactivator and/or prepolymer. It is a preference that each photosensitive component comprises at least a different type of photoactivator, for example a photoactivator that is activated at a different wavelength distribution. Thereby, by modifying the wavelength distribution of the projected projection, and consequently the wavelength distribution of the resulting three-dimensional energy distribution, specific photoactivators can be activated. It is a further preference that each photosensitive component comprises a different prepolymer. Thereby, by selecting a suitable wavelength distribution that corresponds with a specific photosensitive component, a three-dimensional part of an object may be manufactured in a specific material. The prepolymers of the different photosensitive components may for example be configured such that, following polymerization, the resulting polymer material has different mechanical properties.

In an embodiment of the present disclosure the photoinitiators are selected from the list including free radical photoinitiators, cationic photoinitiators, or a combination thereof.

Photoinitiators are molecules that are sensitive to light. Upon light absorption they undergo photochemical cleavage to produce reactive species (either free radicals or a Bronsted or Lewis acid) that will interact with the active components in formulations.

There are 2 classes of photoinitiators: Type I and Type II, wherein Type I photoinitiators are those that undergo unimolecular bond cleavage after absorption of light to render the reactive species. No other species are necessary in order for these photoinitiators to work. Type II photoinitiators undergo a bimolecular reaction. After absorption of light, the photoinitiator reaches an excited state from which it reacts with another molecule (co-initiator or synergist) to create the reactive species. A photosensitizer is a molecule that produces a chemical change in another molecule in a photochemical process.

In an embodiment of the present disclosure the prepolymers are selected from the list including acrylate monomers, epoxy monomers, or a combination thereof.

In an embodiment of the present disclosure the irradiation wavelengths, such as the first wavelength and the second wavelength, are different wavelengths. Said irradiation wavelengths may comprise or consist of wavelength distribution that each consist of a single wave, or multiple wavelengths, such as a wavelength band or multiple separate wavelengths. Thereby, any of the first wavelength, the second wavelength, and/or any further wavelengths may comprise multiple wavelengths, such as one or more wavelengths band, or multiple single wavelengths, wherein any of the first wavelengths, the second wavelength and/or any further wavelengths may partly overlap.

In one specific embodiment of the present disclosure, any of the irradiating wavelengths used for the projections of a specific sequence of projections may overlap with the irradiating wavelengths used for the projections of another sequence of projections. However, it may be a preference that the different photosensitive components do not have overlapping absorption maxima, and/or substantially overlapping absorption spectrum. Consequently, in an embodiment of the present disclosure the different photosensitive components, such as the first photosensitive component and the second photosensitive component, have substantially non-overlapping absorption spectra.

Projection

In an embodiment of the present disclosure said projections are computed, at least in part, by using any one of the following projection algorithms: a Radon-transform; a fan-beam algorithm; a cone-beam algorithm, a tomographic reconstruction filter; an iterative reconstruction technique; an algebraic reconstruction technique; and/or a diffractive tomography algorithm, or a combination thereof.

Consequently, the computation may comprise the application of a Radon-transform followed by a tomographic reconstruction filter; a fan-beam algorithm followed by a tomographic reconstruction filter; a cone-beam algorithm followed by a tomographic reconstruction filter; an iterative reconstruction technique; an algebraic reconstruction technique; or a diffractive tomography algorithm, or a combination thereof. In an embodiment of the present disclosure the projections are obtained by application of at least one projection algorithm to a computer-based model. The method may therefore be seen as a method for producing a multi-material three-dimensional object that is a reproduction of said computer-based model. In an embodiment of the present disclosure, the method is a computer-implemented method or a processor-implemented method.

In an embodiment of the present disclosure, the build volume is irradiated at intervals and/or with light intensities of the respective wavelengths such that the irradiation of the first and the second wavelength is completed at the same time. This typically ensures a higher accuracy in the reproduction of the multi-material three-dimensional object. For example in instances where one of the wavelengths activates both the first and the second photosensitive component, irradiation is preferably arranged such that irradiation of both the first wavelength and the second wavelength is stopped at the same time. In this way light contamination, i.e. undesired polymerization, as a result of continued irradiation of a single wavelength (that activates both the first and the second photoinitiator), can be minimized.

In an embodiment of the present disclosure, the completion of the irradiation of the build volume with light having the first wavelength is completed at the same time point as the light having the second wavelength. In order to achieve this, the point in time for starting the irradiation of the respective wavelengths and/or the intensities of the respective wavelengths have been adjusted such that the irradiation of the first and the second wavelength is finished at the same point in time.

In a preferred embodiment of the present disclosure, the build volume is irradiated simultaneously with light having the first wavelength and the light having the second wavelength.

Sinogram Computation

In a preferred embodiment of the present disclosure, the method comprises at regular intervals, measuring the polymerized first and/or second material, and these measurements are used as feedback to correct subsequent patterns of light in order to improve the accuracy of the reproduced multi-material three dimensional object.

Relative Angle

It is a preference that the orientation and/or the position of at least one of the build volume and the projection unit is modified during projection. For example the projection unit may revolve around the build volume, with the projection constantly pointed towards a center, such as the horizontal center, of the build volume, while the build volume is stationary. Alternatively, the build volume may rotate, typically with a rotation axis that is perpendicular to the plane of projection. Several configurations of the positioning and/or the orientation of the build volume and the projection unit is possible to reconstruct a three-dimensional multi-material object, as known by a person skilled in the art. Further, multiple projection units may be used, wherein the projection units may be positioned at separate positions, for example each projection unit may be positioned at the corresponding position of each projection. Thereby, in a specific embodiment of the present disclosure, the projection units and build volume are stationary, while a number of projection units are positioned at the corresponding angles of the projections of the three-dimensional object to be reconstructed, such as defined during the computation.

As mentioned, multiple configurations of the projection unit and the build volume are possible. In an embodiment of the present disclosure the patterns of light are generated by a first projection unit that is projecting a first pattern of light and a second projection unit that is projection a second pattern of light, wherein the first projection unit projects light substantially perpendicular to the second projection unit. In a specific embodiment of the present disclosure the build volume is rotating around a vertical rotational axis that intersects the center of said build volume. In a further embodiment of the present disclosure the patterns of light are generated by a projection unit that is projecting said patterns of light substantially parallel to a plane of rotation of the build volume. In a further embodiment of the present disclosure the patterns of light are generated by a projection unit that is projecting said patterns of light substantially perpendicular to a plane of rotation of the build volume. In yet a further embodiment of the present disclosure the patterns of light are generated by a first projection unit that is projecting a first pattern of light substantially perpendicular to a plane of rotation of the build volume, and a second projection unit that is projecting a second pattern of light substantially parallel to a plane of rotation of the build volume. In an embodiment of the present disclosure the patterns of light are generated by a projection unit that is revolving around the build volume and projecting said patterns of light towards said build volume.

Post Processing

In an embodiment of the present disclosure the method further comprises a step of removal of uncured parts of the build volume. The removal step preferably is after the step of irradiation of said build volume, such as directly after said step of irradiation of said build volume. In an embodiment of the present disclosure the method further comprises a solvent exchange step, such as for removal of remaining prepolymers and photoinitiators to make the material compatible with living cells. In an embodiment of the present disclosure the solvent exchange comprises immersion of the multi-material three-dimensional object in ethanol or isopropanol, such as for 2 days, followed by immersion in water, such as for two days and with exchange of water two times.

Applications

In an embodiment of the present disclosure the multi-material three-dimensional object is an artificial tissue, such as for in vitro drug screening or in vivo grafting.

In an embodiment of the present disclosure the build volume comprises cells, such as undifferentiated stem cells, for example iPS cells.

In an embodiment of the present disclosure the patterns are produced and/or irradiated by at least one of a spatial light modulator, a digital micromirror device, a galvanometer-scanner, or an acousto-optic deflector. In a specific embodiment of the present disclosure, the patterns are produced and/or irradiated by a DLP projector, LED Projector, LCD projector and/or a Laser projector. It is in general a preference that the patterns are irradiated onto the build volume in a mask-less process, such as without the use of a photo-mask.

System

In a second aspect, the present disclosure relates to a system for producing a multi-material three-dimensional object from a build volume, the system preferably comprises a processing unit for computing a number of projections describing the multi-material three-dimensional object to be formed from different orientation angles of said object. Preferably, said projections comprises a number of first projections describing a first part of said object to be formed in a first material, and a number of second projections describing a second part of said object to be formed in a second material. It should be noted that the first part, the second part, and/or any further parts to be formed in any further material preferably overlap at least partly.

In a further embodiment of the present disclosure, the system comprises a projection system comprising at least one projection unit. The projection system is preferably configured to activate the photosensitive components, preferably subsequent activation of each photosensitive component. It is a further preference that the projection system is configured to emit controlled spatial patterns of light at a wavelength corresponding to an activation wavelength of at least one of the photosensitive components. In a specific embodiment of the present disclosure, the projection unit is configured to emit controlled spatial patterns of light at multiple wavelengths. It is a preference that the projection system is configured to emit controlled spatial patterns of light as defined by the computed projections.

The projection system may comprise a single of multiple projection units that are configured such that the build volume is irradiated, by a projection unit, with a first number of patterns of light, simultaneously and/or sequentially, as the build volume is irradiated, by the same projection unit or a separate projection unit, with a second number of patterns of light. The projection system may for example comprise a first projection unit for irradiating the build volume with a first number of patterns of light that are defined by the first projections, with the light having the first wavelength and a second projection unit for, simultaneously and/or sequentially, irradiating the build volume with a second number of patterns of light that are defined by the second projections, with the light having the second wavelength.

In an embodiment of the present disclosure, the build volume comprises a first photosensitive component capable of polymerizing into a first material upon irradiation by light having a first wavelength. In a further embodiment of the present disclosure, the build volume comprises a second photosensitive component capable of polymerizing into a second material upon irradiation by light having a second wavelength of photosensitive material. In yet a further embodiment of the present disclosure, the build volume comprises any number of further photosensitive components each capable of polymerizing into any number of further materials respectively upon irradiation by light with any number of further wavelengths of photosensitive material. It is a preference that the first material, the second material, and/or any further material differ in any type of property, as disclosed elsewhere herein. It should be further noted that the properties of a part, such as a voxel, of the reconstructed three-dimensional multi-material object may depend on the material polymerized in that voxel, additional said properties may depend on the energy distribution received by that voxel, e.g. the resulting property, such as of the exemplified voxel, may not only depend on being over or below a threshold energy but may be a continuous response to the energy, or a continuous response above a certain threshold energy.

In a further embodiment of the present disclosure, the system comprises a direction adjustment unit. Preferably, the direction adjustment unit is configured for controllably varying a direction of incidence of said patterns of light relative to said build volume. The direction adjustment unit may be rotating the build volume and/or the projection system. Preferably said rotation is configured such that the patterns of light are projected onto the build volume at multiple angles during the irradiating step. The direction adjustment unit may further comprise movement of mirrors and/or lenses, and wherein the illuminating source of the projection units and the build volume are fixed in position and not rotating, however said direction adjustment unit may comprise a number of lenses configured such that the number of patterns of light are projected onto the build volume at the corresponding angles and at the corresponding wavelengths, such as defined in a computation step by a processing unit.

In yet a further embodiment of the present disclosure, the system comprises a controller. Preferably, said controller is configured for controlling the direction adjustment unit and/or the projection unit. It is a further preference that the controller is configured to control the projection unit and the direction adjustment unit such that the build volume is irradiated with the controlled patterns of light at specific wavelengths, from directions corresponding to the different orientation angles. The controller may be a computer, and said computer may further comprise the processing unit.

In a further embodiment of the present disclosure, the system is configured for carrying out the method for producing a multi-material three-dimensional object, as disclosed elsewhere herein. In an embodiment of the present disclosure, the method is a computer-implemented method or a processor-implemented method.

In an embodiment of the present disclosure the system comprises a receptacle, such as a vessel, for containing the build volume and wherein said vessel is optically transparent to the patterns of light. Preferably the receptacle is cylindrical, but may have a multifaceted shape. For example the receptacle may be a vertically extruded polygon, such as a pentagon or decagon. In such cases the system may comprise one projection unit positioned at each face of the multifaceted receptacle.

In an embodiment of the present disclosure the processing unit is configured to compute the projections based on the property distribution of the multi-material three-dimensional object, such as the mechanical property distribution.

In a further embodiment of the present disclosure the processing unit is configured to compute the material to use in the formation of specific parts of the multi-material three-dimensional object based on the property distribution of said object, such as the mechanical property.

In an embodiment of the present disclosure the projections comprise or consist of energy distributions and wherein the processing unit is configured to compute the energy distributions of the projections based on the property distribution of the multi-material three-dimensional object, such as the mechanical property distribution.

In an embodiment of the present disclosure the projections comprise or consist of two-dimensional energy distributions. In a further embodiment of the present disclosure the processing unit is configured to compute the projections, the materials to use, the wavelengths to use for projecting each pattern of light onto the build volume, and/or the corresponding orientation angles. In a further embodiment of the present disclosure, the processing unit is configured for controlling the controller.

In an embodiment of the present disclosure the build volume further comprises at least one further photosensitive component capable of polymerizing into the at least one further material. In principle there is no limitation to the number of materials of the reproduced multi-material three-dimensional object. In one embodiment of the present disclosure the build volume comprises multiple photosensitive components, each responsive to, such as activated and/or polymerized by, a different wavelength distribution, such as a single or multiple wavelengths. It is a further preference that a number of sequences of projections are computed wherein each said sequence comprises a number of projections, at specific orientations, of a three-dimensional multi-material object or model. Upon projection of said sequence of projections onto a build volume, an energy distribution in said build volume is generated for each wavelength distribution, and consequently for activating and/or polymerizing a specific photosensitive component. It is a preference that said specific photosensitive component is selected such that the properties of the reproduced three-dimensional multi-material object correspond to the three-dimensional multi-material object/model. Thereby, for each voxel of the build volume, the projection and the projection of said projection, is configured such that the energy distribution for each wavelength distribution activates and/or polymerizes the specific photosensitive components that renders the voxel of said reproduced three-dimensional multi-material object to have the properties of the three-dimensional multi-material object/model.

In a further embodiment of the present disclosure, the method comprises providing a build volume. The build volume typically comprises a number of components that, when exposed to light, such as light of a specific wavelength, polymerizes into an object. Preferably the build volume comprises a first photosensitive component capable of polymerizing into a first material upon irradiation by light having a first wavelength. The build volume may alternatively or additionally comprise a second photosensitive component capable of polymerizing into a second material upon irradiation by light having a second wavelength, wherein the second wavelength may be different from the first wavelength. It should however be noted that the first and the second photosensitive component may be polymerized by an identical wavelength, but it is in such cases a preference that they have a different response to said identical wavelength. For example they may have different optical absorbances so that one of the first or the second photosensitive component has a faster polymerization reaction. It may for example be a preference that the absorption maximum for the first photosensitive component is different from the absorption maximum for the second photosensitive component.

In a further embodiment of the present disclosure the system comprises a build volume comprising at least two photosensitive components including a first photosensitive component capable of polymerizing into the first material upon irradiation by light having a first wavelength; and a second photosensitive component capable of polymerizing into the second material upon irradiation by light having a second wavelength of photosensitive material. In a further embodiment of the present disclosure, the build volume comprises a number of further photosensitive components, each respectively capable of polymerizing into a number of further materials upon irradiation by light with a number of further wavelengths.

In an embodiment of the present disclosure the projection unit is configured to irradiate the build volume with light of different wavelengths. The projection unit may be configured to project a number of first projections in a wavelength distribution, such as a wavelength or a wavelength band, before projecting a number of second projections in another wavelength distribution. Typically, the first projections are configured such that they, at the corresponding orientations, following activation of a first photosensitive component, forms the first material, at a first part of the three-dimensional multi-material object, while the second projections are configured such that they, at the corresponding orientations, following activation of a first photosensitive component, forms the second material, at a second part of the three-dimensional multi-material object.

In an embodiment of the present disclosure the system comprises a second projection unit that is configured to further irradiate the build volume with at least one pattern of light from an angle that is perpendicular to pattern of light from the (first) projection unit.

In an embodiment of the present disclosure the projection unit is configured to sequentially emit multiple wavelength distributions. In a specific embodiment of the present disclosure, the projection unit comprises multiple light sources having different wavelength distributions, and/or a single light source arranged to produce multiple separated wavelengths, such as a single light source coupled with a filtering unit configured for wavelength filtering, such as for selecting desired wavelengths for example the first wavelength or the second wavelength. The light source(s) may for example be one or more LEDs and/or lasers.

In an embodiment of the present disclosure the projection unit comprises at least one of a spatial light modulator, a digital micromirror device, a galvanometer-scanner, or an acousto-optic deflector. In a specific embodiment of the present disclosure, the projection unit is a DLP projector, LED Projector, LCD projector and/or a Laser projector. It is in general a preference that the patterns are irradiated onto the build volume in a mask-less process, i.e. without the use of a photo-mask.

In general, it is a preference that the projection unit is arranged to form, preferably simultaneously, a number of patterns of lights wherein said patterns comprises light having a first wavelength that is to deposit energy according to a first energy distribution and light having a second wavelength that is to deposit energy according to a second energy distribution. The projection unit is preferably arranged to irradiate the build volume with said patterns of light simultaneously, and as such, does preferably not rely on formation of patterns by the use of photomasks and/or filters.

By the irradiation, of the build volume, with a number of patterns of light as defined by the projections, resulting in separate energy distributions of different wavelengths allows for the formation of objects comprising graded materials and/or parts, such as voxels, comprising both a first and a second material.

In a preferred embodiment of the present disclosure, the build volume is simultaneously irradiated with a number of patterns of light, such as defined by the projections, at the respective corresponding orientations and wavelengths such that the light having the first wavelength deposits energy according to a first energy distribution and wherein the light having the second wavelength deposits energy according to a second energy distribution. Preferably, the method comprises irradiating, the build volume, with light having a first wavelength simultaneously as light having a second wavelength. Preferably wherein the build volume comprises multiple photosensitive components that are separately responsive to said first and second wavelength.

In an embodiment of the present disclosure the light source comprises one or more incandescent lamps, such as a halogen lamp, or one or more luminescent lamps, such as a laser, an LED, or an electric discharge lamp.

It is a preference that the orientation and/or the position of at least one of the build volume and the projection unit is modified during projection. For example the projection unit may revolve around the build volume, with the projection constantly pointed towards a center, such as the horizontal center, of the build volume, while the build volume is stationary. Alternatively, the build volume may rotate, typically with a rotation axis that is perpendicular to the plane of projection. Several configurations of the positioning and/or the orientation of the build volume and the projection unit is possible to reconstruct a three-dimensional multi-material object, as known by a person skilled in the art. Further, multiple projection units may be used, wherein the projection units may be positioned at separate positions, for example each projection unit may be positioned at the corresponding position of each projection. Thereby, in a specific embodiment of the present disclosure, the projection units and build volume are stationary, while a number of projection units are positioned at the corresponding angles of the projections of the three-dimensional object to be reconstructed, such as defined during the computation.

As mentioned, multiple configurations of the projection unit and the build volume are possible. In a specific embodiment of the present disclosure the build volume is rotating around a vertical rotational axis that intersects the center of said build volume. In a further embodiment of the present disclosure the patterns of light are generated by a projection unit that is projecting said patterns of light substantially parallel to a plane of rotation of the build volume. In a further embodiment of the present disclosure the patterns of light are generated by a projection unit that is projecting said patterns of light substantially perpendicular to a plane of rotation of the build volume. In yet a further embodiment of the present disclosure the patterns of light are generated by a first projection unit that is projecting a first pattern of light substantially perpendicular to a plane of rotation of the build volume, and a second projection unit that is projecting a second pattern of light substantially parallel to a plane of rotation of the build volume. In an embodiment of the present disclosure the patterns of light are generated by a projection unit that is revolving around the build volume and projecting said patterns of light towards said build volume.

In preferred embodiments of the present disclosure, the patterns of light are generated by a first projection unit that is projecting a first pattern of light and a second projection unit that is projection a second pattern of light, wherein the first projection unit projects light substantially perpendicular to the second projection unit.

In an embodiment of the present disclosure the direction adjustment unit is configured to either rotate the build volume within the field of illumination of the first projection unit, and/or to revolve the first projection unit around the build volume, such as while the projection unit is constantly directed at the build volume.

In an embodiment of the present disclosure the system is configured such that the build volume is illuminated with a first sequence of spatial light patterns at a first wavelength distribution, and concurrently or subsequently said build volume is illuminated with a second sequence of spatial light patterns at second wavelength until the multi-material three-dimensional object is formed.

In another embodiment of the present disclosure the system is configured such that the build volume is illuminated with a first sequence of spatial light patterns at a first wavelength distribution, and concurrently or subsequently said build volume is illuminated with a second sequence of spatial light patterns at second wavelength, and concurrently or subsequently said build volume is illuminated with any number of further sequences of spatial light patterns, each respectively illuminated at any number of further wavelengths, until the multi-material three-dimensional object is formed.

DETAILED DESCRIPTION OF DRAWINGS

The invention will in the following be described in greater detail with reference to the accompanying drawings. The drawings are exemplary and are intended to illustrate some of the features of the presently disclosed methods and systems for producing a multi-material three-dimensional object, and are not to be construed as limiting to the presently disclosed invention.

Figure 1B:
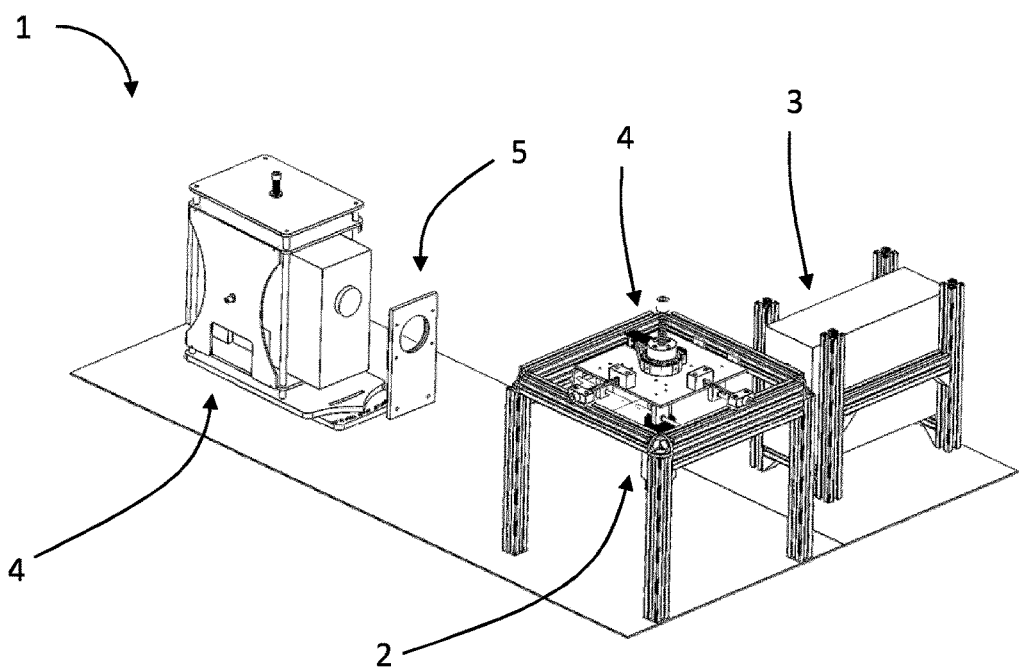

FIG. 1 shows a tomographic vat photopolymerization system (1) for producing a multi-material three-dimensional object from a build volume according to a specific embodiment of the present disclosure. FIG. 1A shows a system wherein a build volume is contained by a receptacle (2). The exemplary system comprises a projection system comprising two projection units, i.e. a first projection unit and a second projection unit. The first projection unit is a visible light DLP projector (3) and the second projection unit is an ultraviolet light DLP projector (4). Both of said projection units of said projection system are fixed in position, and oriented such that they illuminate at least a part of the build volume. As shown, the system may comprise optics (5), such as lenses, between the projector and the receptacle. The receptacle, while fixed in position, is suspended from a direction adjustment unit (5), herein exemplified as a rotation stage. Thereby, the build volume is capable of rotating, while the projector units irradiate a number of patterns of light at their respective corresponding orientations and wavelengths. FIG. 1B shows an identical system, from an alternate angle.

Figure 2:
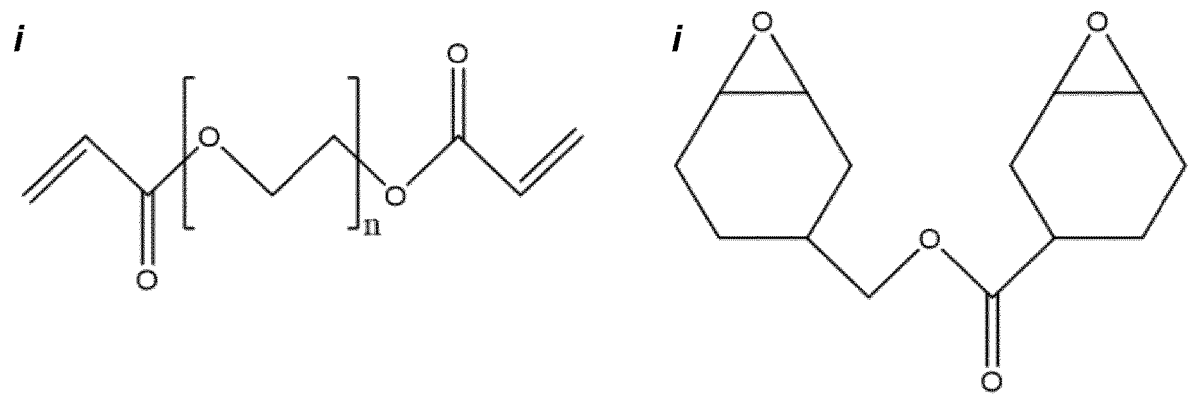
FIG. 2 shows structural formulas for exemplary monomers.

FIG. 2 shows structural formulas for exemplary monomers that may be used for producing a multi-material three-dimensional object. i. polyethylene glycol diacrylate (PEGDA); ii. 3,4-epoxycyclohexylmethyl 3,4-epoxy-cyclohexanecarboxylate (EEC). Different monomers may result in the polymerization of a material having different properties, such as mechanical properties. Typically, materials based on PEGDA monomers are softer than those based on EEC. PEGDA may be used together with a photoinitiator that activates at specific wavelengths in the visible range, while EEC may be used together with a photoinitiator that activates at specific wavelength in the UV-range. Thereby, the system may be configured to produce specific three-dimensional energy distributions, for each photoinitiator associated with EEC and PEGDA. Two distributions may be superposed upon the same geometry to define the relative light intensity voxel-by-voxel.

Figure 3:
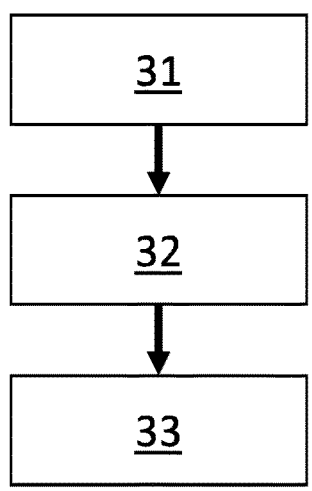
FIG. 3 shows a flowchart outlining a method for producing a multi-material three-dimensional object according to a specific embodiment of the present disclosure.

FIG. 3 shows a flowchart outlining a method for producing a multi-material three-dimensional object according to a specific embodiment of the present disclosure. The method may comprise computing a number of projections (31), said projections describing the multi-material three-dimensional object to be formed from different orientation angles of said object, including: a number of first projections describing a first part of said object to be formed in a first material; a number of second projections describing a second part of said object to be formed in a second material. Typically a number of projection sequences are computed, such as a first projection sequence comprising the first projections, and a second projection sequence comprising the second projections. The method further comprises providing a build volume (32). Said build volume typically comprises a first photosensitive component capable of polymerizing into the first material upon irradiation by light having a first wavelength; and a second photosensitive component capable of polymerizing into the second material upon irradiation by light having a second wavelength. The method may further comprise irradiating (33), based on said projections, with a number of patterns of light at the respective corresponding orientations and wavelengths; thereby physically reproducing said multi-material three-dimensional object.

Figure 4:
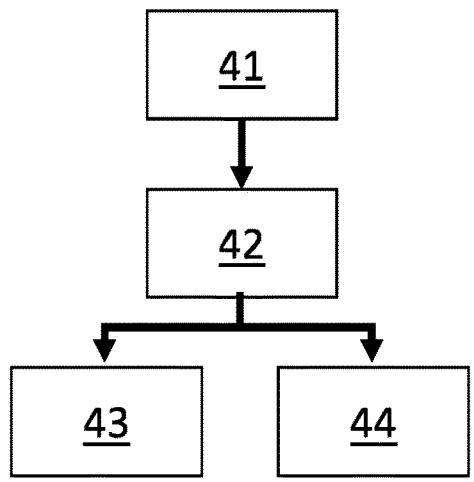
FIG. 4 shows a flowchart outlining the communication between components of a system for producing a multi-material three-dimensional object from a build volume according to a specific embodiment of the present disclosure.

FIG. 4 shows a flowchart for the communication between components of a system for producing a multi-material three-dimensional object from a build volume according to a specific embodiment of the present disclosure. A processing unit (41) may be used to compute a number of projections describing the multi material three-dimensional object to be formed from different orientation angles of said object. Said orientation angles may include a number of first projections describing a first part of said object to be formed in a first material and a number of second projections describing a second part of said object to be formed in a second material. The first projections and the second projections are communicated to a controller (42). The controller may for example be a computer, either a computer separate from the processing unit or the same computer. The controller is in connection with a direction adjustment unit (43) and a projection system (44) comprising at least one projection unit. The direction adjustment unit is configured for controllably varying a direction of incidence of said patterns of light relative to said build volume. The at least one projection unit is configured for emitting controlled spatial patterns of light at multiple wavelengths, said controlled spatial patterns being derived from the projections. The controller being configured to control the direction adjustment unit and the at least one projection unit such that a build volume is irradiated with the controlled patterns of light at specific wavelengths, from directions corresponding to the different orientation angles.

Figure 5:
FIG. 5 shows an exemplary multi-material three dimensional object.

FIG. 5 shows an illustration of an exemplary multi-material three dimensional object. The object comprises a baby Yoda FIG. 51) with an isotropic mechanical property, a brain (52) with a low Young's modulus, a heart (53) with a moderate Young's modulus, and a lightsaber (53), with a high Young's modulus. Thereby, the multi-material three dimensional object comprises multiple properties, herein exemplified as mechanical properties. For the final object, to be reproduced, the figure, the brain, the heart and the lightsaber are merged into a continuous solid object with varying mechanical properties, for example a varying degree of stiffness.

Figure 6A:
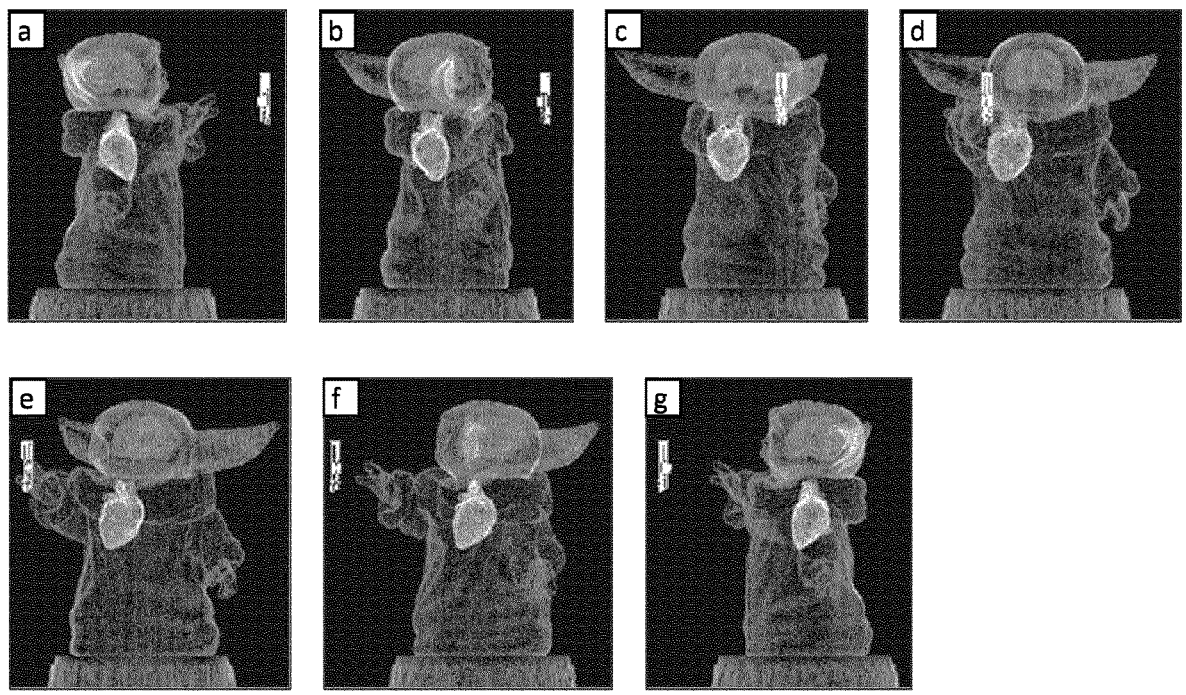
FIG. 6 shows projections of a multi-material three dimensional object.
Figure 6B:
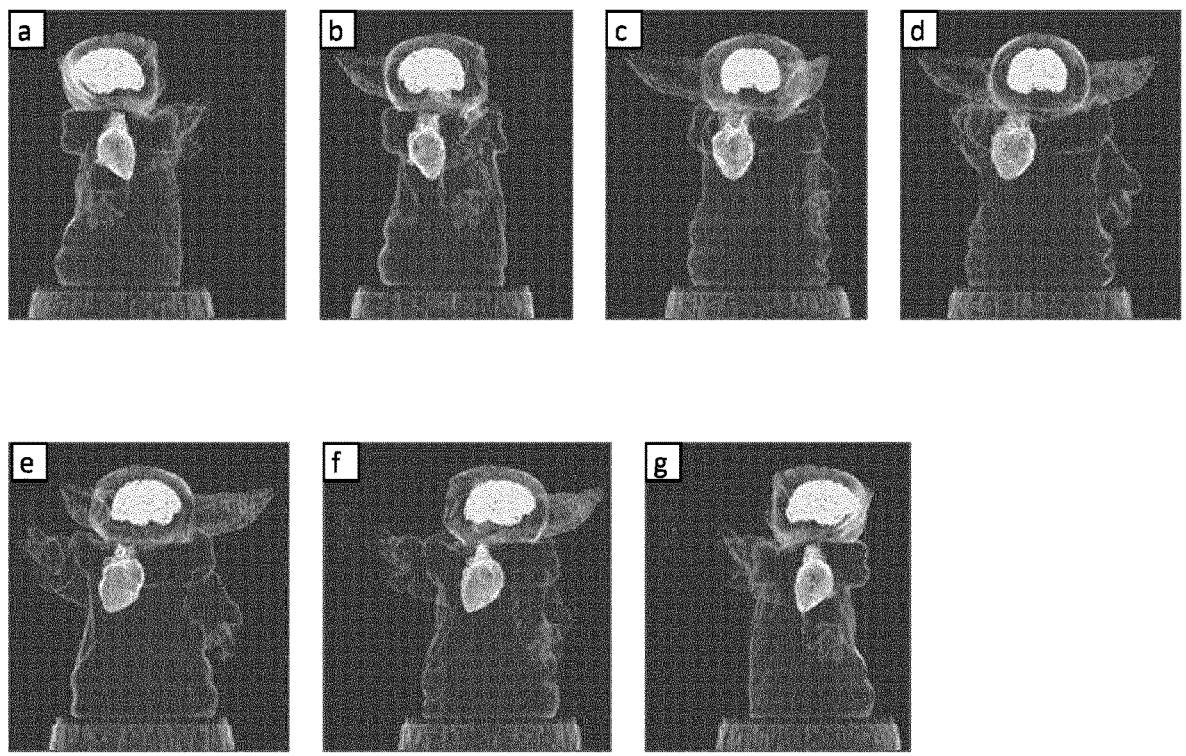

FIG. 6 shows projections of the multi-material three dimensional object shown in FIG. 5. FIG. 6A shows a number of first projections describing a first part of said object to be formed in a first material, while FIG. 6B shows a number of second projections describing a second part of said object to be formed in a second material. In this example, each first projection has an equivalent orientation angle among the second projections, for example FIG. 6A (a) corresponds to FIG. 6B (a), FIG. 6A (b) corresponds to FIG. 6B (b), and so on. The gray-value of each image represents the intensity of the light projected onto the build volume. Thereby, as the light, for each projection/pattern of light, is projected the same amount of time, the ratio between the dose for each wavelength at each orientation can be seen. The first projections are used for irradiating a corresponding number of patterns of light at the respective corresponding orientations at a first wavelength distribution, herein exemplified as UV light. Similarly, the second projections are used for irradiating a corresponding number of patterns of light at the respective corresponding orientations at a second wavelength distribution, herein exemplified as visible light. In this example, the build volume comprises two different photosensitive components. The first photosensitive is exemplified as comprising 3,4-epoxycyclohexylmethyl 3,4-epoxy-cyclohexanecarboxylate (EEC), and a photoinitiator that is activated upon irradiating with UV light, for example a cationic photoinitiator based on triarylsulfonium hexafluoroantimonate salts (CAT2) that is activated using 365 nm illumination. The second photosensitive component is exemplified as comprising Polyethyleneglycol Diacrylate (PEGDA) and a photoinitiator that is activated upon irradiating with visible light, such as the radical photoinitiator camphorquinone that is activated using 450 nm illumination. The illumination light may be filtered, for example low-pass, band-pass, or high-pass filtering, in order to increase the selectivity of the first and the second wavelength, such that each wavelength only activates one photosensitive component, or such that only one one wavelength is capable of activating both photosensitive components. It is a preference that only one photosensitive component is activated upon illumination with each number of patterns of light, such as each wavelength, for example the first or the second wavelength.

Items

1. A method for producing a multi-material three-dimensional object comprising:
    computing a number of projections describing the multi-material three-dimensional object to be formed from different orientation angles of said object, including:
        a number of first projections describing a first part of said object to be formed in a first material;
        a number of second projections describing a second part of said object to be formed in a second material;
    providing a build volume comprising:
        a first photosensitive component capable of polymerizing into the first material upon irradiation by light having a first wavelength;
        a second photosensitive component capable of polymerizing into the second material upon irradiation by light having a second wavelength, the second material having different mechanical properties than the first material; and
    irradiating the build volume with a number of patterns of light, as defined by the projections, at the respective corresponding orientations and wavelengths such that the light having the first wavelength deposits its energy according to a first energy distribution and wherein the light having the second wavelength deposits energy according to a second energy distribution; thereby physically reproducing said multi-material three-dimensional object.
2. The method according to item 1, wherein the mechanical property, of each point of the reproduced multi-material three-dimensional object, is determined by the ratio between the first energy distribution and the second energy distribution deposited to said point.
3. The method according to any one of the preceding items, wherein the step of computation of the first projections and the second projections is defined by the mechanical property distribution of the multi-material three-dimensional object.
4. The method according to any one of the preceding items, wherein the first material is stiffer than the second material, and wherein the step of irradiating comprises depositing a higher dose of the light having the first wavelength relative to the light having the second wavelength, at points of the multi-material three-dimensional object that are stiffer.
5. The method according to any one of the preceding items, wherein the multi-material three-dimensional object is reproduced in a number of voxels of the build volume, and wherein the step of computing comprises determining, for each of said voxels, a ratio between the light having the first wavelength and the light having the second wavelength such that, upon irradiation of said voxels by said ratios, the mechanical properties of each voxel is determined.
6. The method according to any one of the preceding items, wherein the first photosensitive component comprises an epoxy monomer and a first photoinitiator that is activated upon irradiation by the light having the first wavelength, and wherein the second photosensitive component comprises an acrylate monomer and a second photoinitiator that is activated upon irradiation by the light having the second wavelength and/or the first wavelength.
7. The method according to any one of the preceding items, wherein the step of irradiating comprises:
    irradiating the build volume, by a first projection unit, with a first number of patterns of light that are defined by the first projections, with the light having the first wavelength; and
    irradiating the build volume, by a second projection unit, with a second number of patterns of light that are defined by the second projections, with the light having the second wavelength;
    wherein the first projection unit, the second projection unit, and the build volume are located in a plane, and wherein the build volume rotates with an axis of rotation that is perpendicular to said plane and intersects the center of said build volume.
8. The method according to any one of the preceding items wherein said projections are computed using any one of the following list: a Radon-transform followed by a tomographic reconstruction filter; a fan-beam algorithm followed by a tomographic reconstruction filter; and/or a cone-beam algorithm followed by a tomographic reconstruction filter.
9. The method according to any one of the preceding items, wherein one of the first wavelength and the second wavelength is in the UV region and the other in the visible region.
10. The method according to any one of the preceding items, wherein the reproduced multi-material three-dimensional object comprises or consists of a functionally graded material.

11. The method according to any one of the preceding items, wherein the multi-material three-dimensional object comprises portions with Young's moduli that differ at least two orders of magnitude.
12. The method according to any one of the preceding items, wherein the multi-material three-dimensional object is an artificial tissue, such as for in vitro drug screening or in vivo grafting.
13. The method according to any one of the preceding items, wherein the build volume comprises cells, and wherein the cells are arranged such that upon irradiation of the build volume, the cells are incorporated into the multi-material three-dimensional object.
14. The method according to any one of the preceding items, wherein the computation of the first projections and the second projections is defined by the mechanical property distribution of the multi-material three-dimensional object.
15. The method according to any one of the preceding items, wherein the computation of the material to use in the formation of specific parts of the multi-material three-dimensional object is defined by the mechanical property distribution of said object.
16. The method according to any one of the preceding items, wherein each projection comprises or consists of an energy distribution and wherein the computation of the energy distributions of the projections is defined by the mechanical property distribution of the multi-material three-dimensional object.
17. The method according to any one of the preceding items, wherein the mechanical properties of the materials differ, such as the first and the second material, such as when completely polymerized.
18. The method according to any one of the preceding items, wherein the build volume is provided with an energy distribution, during the irradiating step, that determines the distribution of the mechanical properties of the multi-material three-dimensional object.
19. The method according to item 18 wherein the energy distribution is different for each wavelength.
20. The method according to any one of the preceding items, wherein at least a portion of the parts of the multi-material three-dimensional object to be formed in the first material and the second material overlap.
21. The method according to any one of the preceding items, wherein the reproduced multi-material three-dimensional object is composed of a graded material.
22. The method according to any one of the preceding items, wherein the multi-material three-dimensional object comprises portions with Young's moduli that differ at least two orders of magnitude.
23. The method according to any one of the preceding items, wherein the step of computing comprises computing a number of third projections describing a third part of said object to be formed in a third material.
24. The method according to item 23, wherein the build volume comprises a third photosensitive component capable of polymerizing into the third material upon irradiation by light with a third wavelength .
25. The method according to any one of the preceding items, wherein each of the photosensitive components comprise:
    a. a prepolymer, such as a monomer; and
    b. a photoinitiator that is activated upon irradiation by light with an initiation wavelength, such as the first wavelength and the second wavelength, that is different for each photosensitive component.
26. The method according to any one of the preceding items, wherein each photosensitive component comprises a different type of photoinitiator and/or prepolymer.
27. The method according to any one of the preceding items, wherein the photoinitiators are selected from the list including free radical photoinitiators, cationic photoinitiators, or a combination thereof.
28. The method according to any one of the preceding items, wherein the prepolymers are selected from the list including acrylate monomers, epoxy monomers, or a combination thereof.
29. The method according to any one of the preceding items, wherein the irradiation wavelengths, such as the first wavelength and the second wavelength, are different wavelengths.
30. The method according to any one of the preceding items, wherein the photosensitive components, such as the first photosensitive component and the second photosensitive component, have substantially non-overlapping absorption spectra.
31. The method according to any one of the preceding items wherein said projections are computed using any one of the following list: a Radon-transform followed by a tomographic reconstruction filter; a fan-beam algorithm followed by a tomographic reconstruction filter; a cone-beam algorithm followed by a tomographic reconstruction filter; an iterative reconstruction technique; an algebraic reconstruction technique; or a diffractive tomography algorithm.
32. The method according to any one of the preceding items, wherein the build volume is rotating around a vertical rotational axis that intersects the center of said build volume.
33. The method according to any one of the preceding items, wherein the patterns of light are generated by a projection unit that is projecting said patterns of light substantially parallel to a plane of rotation of the build volume.
34. The method according to any one of item 1-31, wherein the patterns of light are generated by a projection unit that is revolving around the build volume and projecting said patterns of light towards said build volume.
35. The method according to any one of the preceding items, wherein the method further comprises removal of uncured parts of the build volume, following irradiation of said build volume.
36. The method according to any one of the preceding items, wherein the method further comprises a solvent exchange, such as for removal of remaining prepolymers and photoinitiators to make the material compatible with living cells.
37. The method according to any one of the preceding items, wherein the solvent exchange comprises immersion of the multi-material three-dimensional object in ethanol, such as for 2 days, followed by immersion in water, such as for two days and with exchange of water two times.
38. The method according to any one of the preceding items, wherein the multi-material three-dimensional object is an artificial tissue, such as for in vitro drug screening or in vivo grafting.
39. The method according to any one of the preceding items, wherein the build volume comprises cells, such as undifferentiated stem cells, for example iPS cells.

40. A system for producing a multi-material three-dimensional object from a build volume, the system comprising:
   a processing unit for computing a number of projections describing the multi material three-dimensional object to be formed from different orientation angles of said object, including:
      a number of first projections describing a first part of said object to be formed in a first material;
      a number of second projections describing a second part of said object to be formed in a second material;
   a projection system capable of emitting controlled spatial patterns of light at multiple wavelengths, said controlled spatial patterns being derived from the projections;
   the build volume comprising:
      a first photosensitive component capable of polymerizing into the first material upon irradiation by light having a first wavelength; and
      a second photosensitive component capable of polymerizing into the second material upon irradiation by light having a second wavelength of photosensitive material;
   a direction adjustment unit for controllably varying a direction of incidence of said patterns of light relative to said build volume; and
   a controller configured for controlling the direction adjustment unit and the projection system such that the build volume is irradiated with a number of patterns of light, as defined by the projections, at the respective corresponding orientations and wavelengths such that the light having the first wavelength deposits energy according to a first energy distribution and wherein the light having the second wavelength deposits energy according to a second energy distribution.

41. The system according to item 40, wherein said system is configured to carry out the method according to any one of items 1-39.

42. The system according to any one of items 40-41, further comprising a vessel for containing the build volume and wherein said vessel is optically transparent to the patterns of light.

43. The system according to any one of items 40-42, wherein the processing unit is configured to compute the projections based on the mechanical property distribution of the multi-material three-dimensional object.

44. The system according to any one of items item 40-43, wherein the processing unit is configured to compute the material to use in the formation of specific parts of the multi-material three-dimensional object based on the mechanical property distribution of said object.

45. The system according to any one of items item 40-44, wherein the projections comprise or consist of energy distributions and wherein the processing unit is configured to compute the energy distributions of the projections based on the mechanical property distribution of the multi-material three-dimensional object.

46. The system according to any one of items 40-45, wherein the system comprises a build volume comprising at least two photosensitive components including:
   a. a first photosensitive component capable of polymerizing into the first material upon irradiation by light having a first wavelength;
   b. a second photosensitive component capable of polymerizing into the second material upon irradiation by light having a second wavelength of photosensitive material, 47. The system according to any one of items 40-46, wherein the projection unit is configured to irradiate the build volume with light of different wavelengths.

48. The system according to any one of items 40-47, wherein the projection unit is configured to further irradiate the build volume with patterns of light at a second wavelength of light, such as from another angle.

49. The system according to any one of items 40-48, wherein the projection unit comprises multiple light sources having different spectra, or a single light source arranged to produce multiple separated wavelength, such as a single light source coupled to a filtering unit configured for filtering out wavelengths, such as the first wavelength or the second wavelength.

50. The system according to any one of items 40-49, wherein the projection unit comprises at least one of a spatial light modulator, a digital micromirror device, a galvanometer-scanner, or an acousto-optic deflector.

51. The system according to any one of items 40-50, wherein the light source comprises one or more incandescent lamps, such as a halogen lamp, or one or more luminescent lamps, such as a laser, an LED, or an electric discharge lamp.

52. The system according to any one of items 40-51, wherein the direction adjustment unit is configured to either rotate the build volume within the field of illumination of the first projection unit, and/or to rotate the first projection unit relative to the build volume.

53. The system according to any one of items 40-52 wherein the first projection unit is oriented such that the illumination direction is parallel to the plane of rotation of the build volume.

54. The system according to any one of items 40-53, wherein the system is configured such that the build volume is illuminated with a first sequence of spatial light patterns at a first wavelength, and concurrently or subsequently said build volume is illuminated with a second sequence of spatial light patterns at a second wavelength until the multi-material three-dimensional object is formed.

The invention claimed is:

1. A method for producing a multi-material three-dimensional object comprising:
   computing a plurality projections describing the multi-material three-dimensional object to be formed from different orientation angles of said object, including:
      a plurality of first projections describing a first part of said object to be formed in a first material;
      a plurality of second projections describing a second part of said object to be formed in a second material;
   providing a single build volume comprising both (i)
      a first photosensitive component capable of polymerizing into the first material upon irradiation by light having a first wavelength and (ii)
      a second photosensitive component, chemically distinct from the first photosensitive component, capable of polymerizing into the second material upon irradiation by light having a second wavelength, the second material having different mechanical properties than the first material; and
   concurrently irradiating the build volume with patterns of light derived from the first projections, at the first wavelength, and from the second projections, at the second wavelength, such that: (a) light having the first wavelength deposits energy to a plurality of voxels of the build volume according to a first energy distribution, and (b) light having the second wavelength deposits energy to said voxels according to a second energy distribution, wherein the build volume is simultaneously irradiated with the light having the first wavelength and the light having the second wavelength; thereby physically producing said multi-material three-dimensional object in a single continuous volumetric build process.

2. The method according to claim 1, wherein the mechanical property distribution of the produced multi-material three-dimensional object is defined by the ratio between the first energy distribution and the second energy distribution for each voxel.

3. The method according to claim 1, wherein the first material is stiffer than the second material, and wherein the step of irradiating comprises depositing a higher dose of the light having the first wavelength relative to the light having the second wavelength, at corresponding voxels of the multi-material three-dimensional object that are stiffer.

4. The method according to claim 1, wherein the step of computing comprises defining, for each voxel, a ratio between the light having the first wavelength and the light having the second wavelength, based on the desired mechanical property of said voxel.

5. The method according to claim 1, wherein one of the first wavelength and the second wavelength is in the UV region and the other in the visible region.

6. The method according to claim 1, wherein completion of the irradiation of the build volume with light having the first wavelength is completed simultaneously as light having the second wavelength.

7. The method according to claim 1, wherein each of the photosensitive components comprises:
 a. a prepolymer, and
 b. a photoinitiator that is activated upon irradiation by light with an initiation wavelength, that is different for each photosensitive component
 wherein activation of the photoinitiator polymerizes the prepolymer.

8. The method according to claim 1, wherein the first photosensitive component comprises an epoxy monomer and a first photoinitiator that is activated upon irradiation by the light having the first wavelength, and
 wherein the second photosensitive component comprises an acrylate monomer and a second photoinitiator that is activated upon irradiation by the light having the second wavelength or the first wavelength.

9. The method according to claim 1, wherein the produced multi-material three-dimensional object comprises voxels of both the first material and the second material.

10. The method according to claim 1, wherein the produced multi-material three-dimensional object comprises parts having Young's moduli that differ at least two orders of magnitude.

11. The method according to claim 1, wherein the build volume comprises cells, and wherein the cells are arranged such that upon irradiation of the build volume, the cells are incorporated into the produced multi-material three-dimensional object.

12. A system for producing a multi-material three-dimensional object from a build volume, the system comprising:
 a processing unit configured for computing a number of projections describing the multi material three-dimensional object to be formed from different orientation angles of said object, including:
  a number of first projections describing a first part of said object to be formed in a first material;
  a number of second projections describing a second part of said object to be formed in a second material;
 a projection system capable of emitting controlled spatial patterns of light at multiple wavelengths, said controlled spatial patterns being derived from the projections;
 the build volume comprising:
  a first photosensitive component capable of polymerizing into the first material upon irradiation by light having a first wavelength; and
  a second photosensitive component capable of polymerizing into the second material upon irradiation by light having a second wavelength, the second material having different mechanical properties than the first material;
 a direction adjustment unit for controllably varying a direction of incidence of said patterns of light relative to said build volume; and
 a controller configured for controlling the direction adjustment unit and the projection system such that the build volume is irradiated with a number of patterns of light, as defined by the projections, at the respective corresponding orientations and wavelengths, the build volume being irradiated with light having the first wavelength and light having the second wavelength at the same time, such that the light having the first wavelength deposits energy to a number of voxels of the build volume according to a first energy distribution, and the light having the second wavelength deposits energy to said voxels according to a second energy distribution, such that the formation of the first and second materials occurs in a single continuous volumetric build process.

13. The system according to claim 12, wherein the processing unit is configured to compute the projections based on the mechanical property distribution of the multi-material three-dimensional object.

14. The system according to claim 12, wherein the processing unit is configured to compute the projections based on the mechanical property distribution of the multi-material three-dimensional object to be produced.

15. The system according to claim 12, wherein the projection system comprises at least one projection unit selected from the list including: a spatial light modulator, a digital micromirror device, a galvanometer-scanner, or an acousto-optic deflector.

16. The system according to claim 12, wherein the direction adjustment unit is configured to either rotate the build volume or to rotate at least a part of the projection system.

17. The system according to claim 12, wherein the projection system is arranged with an illumination direction that is parallel to a plane of rotation of the build volume.

18. The system according to claim 12, wherein the system is configured such that the build volume is illuminated with a first sequence of spatial light patterns at a first wavelength, and concurrently with a second sequence of spatial light patterns at a second wavelength until the multi-material three-dimensional object is produced.

* * * * *